(12) United States Patent
Wu (10) Patent No.: US 9,728,647 B2
(45) Date of Patent: Aug. 8, 2017

(54) TFT SUBSTRATE STRUCTURE AND MANUFACTURING METHOD THEREOF

(71) Applicant: Shenzhen China Star Optoelectronics Technology Co., Ltd., Shenzhen (CN)

(72) Inventor: Yue Wu, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 126 days.

(21) Appl. No.: 14/777,744

(22) PCT Filed: Aug. 21, 2015

(86) PCT No.: PCT/CN2015/087726
§ 371 (c)(1),
(2) Date: Sep. 17, 2015

(87) PCT Pub. No.: WO2017/016007
PCT Pub. Date: Feb. 2, 2017

(65) Prior Publication Data
US 2017/0141236 A1    May 18, 2017

(30) Foreign Application Priority Data

Jul. 24, 2015 (CN) .......................... 2015 1 0445457

(51) Int. Cl.
*H01L 21/28* (2006.01)
*H01L 29/786* (2006.01)
(Continued)

(52) U.S. Cl.
CPC ...... *H01L 29/78606* (2013.01); *H01L 21/022* (2013.01); *H01L 21/0262* (2013.01);
(Continued)

(58) Field of Classification Search
CPC ........... H01L 29/1606; H01L 29/78684; H01L 29/45; H01L 29/7869
See application file for complete search history.

(56) References Cited

U.S. PATENT DOCUMENTS 8,076,204 B2 * 12/2011 Anderson ........... H01L 29/1606
257/328
9,091,648 B2 * 7/2015 Afzali-Ardakani G01N 33/5438

(Continued)

*Primary Examiner* — Bradley K Smith
*Assistant Examiner* — David Goodwin
(74) *Attorney, Agent, or Firm* — Leong C. Lei (57) ABSTRACT

The present invention provides a TFT substrate structure and a manufacturing method thereof. In the manufacturing method of a TFT substrate structure according to present invention, a graphene layer is formed on a semiconductor layer and after the formation of a second metal layer, the second metal layer is used as a shielding mask to conduct injection of fluoride ions into the graphene layer to form a modified area in a portion of the graphene layer that is located on and corresponds to a channel zone of the semiconductor layer, wherein the modified area of the graphene layer shows a property of electrical insulation and a property of blocking moisture/oxygen so as to provide protection to the channel zone; portions of the graphene layer that are located under source and drain electrodes are not doped with ions and preserves the excellent electrical conduction property of graphene and thus electrical connection between the source and drain electrodes and the semiconductor layer can be achieved without formation of a via in the graphene layer, making a TFT device so manufactured showing excellent I-V (current-voltage) output characteristics and stability, saving one mask operation process, shortening the manufacturing time, and lowering down the manufacturing cost.

11 Claims, 4 Drawing Sheets (51) Int. Cl.
*H01L 29/49* (2006.01)
*H01L 27/12* (2006.01)
*H01L 21/02* (2006.01)

(52) U.S. Cl.
CPC .. *H01L 21/02115* (2013.01); *H01L 21/02282* (2013.01); *H01L 21/02532* (2013.01); *H01L 21/02565* (2013.01); *H01L 21/02584* (2013.01); *H01L 21/02592* (2013.01); *H01L 21/02631* (2013.01); *H01L 27/127* (2013.01); *H01L 27/1222* (2013.01); *H01L 27/1225* (2013.01); *H01L 27/1288* (2013.01); *H01L 29/4908* (2013.01); *H01L 29/7869* (2013.01); *H01L 29/78669* (2013.01); *H01L 29/78696* (2013.01)

(56) References Cited

U.S. PATENT DOCUMENTS

| | | | |
|---|---|---|---|
| 9,543,156 B1* | 1/2017 | Hu | H01L 21/28247 |
| 2012/0074387 A1* | 3/2012 | King | H01L 21/02381 |
| | | | 257/29 |
| 2012/0085991 A1* | 4/2012 | Cohen | B82Y 10/00 |
| | | | 257/28 |
| 2013/0032794 A1* | 2/2013 | Lee | H01L 29/45 |
| | | | 257/43 |
| 2013/0043475 A1* | 2/2013 | Kim | H01L 29/78633 |
| | | | 257/59 |
| 2014/0239257 A1* | 8/2014 | Moon | H01L 29/78684 |
| | | | 257/29 |
| 2015/0249034 A1* | 9/2015 | Kondo | H01L 21/76251 |
| | | | 438/151 |
| 2017/0077235 A1* | 3/2017 | Caudillo | B82Y 25/00 |

* cited by examiner

TFT SUBSTRATE STRUCTURE AND MANUFACTURING METHOD THEREOF

BACKGROUND OF THE INVENTION

1. Field of the Invention

The present invention relates to the field of display technology, and in particular to a thin-film-transistor (TFT) substrate structure and a manufacturing method thereof.

2. The Related Arts

In the active matrix display technology, each pixel is driven by a thin-film transistor (TFT) that is integrated on the back side thereof in order to achieve a screen displaying effect of high speed, high brightness, and high contrast. A common TFT is composed of three electrodes of gate/source/drain, insulation layers, and a semiconductor layer. The gate electrode controls a working area (depletion zone and accumulation zone) of the semiconductor layer in order to control on/off the TFT. The semiconductor layer comprises a channel formed therein. For a TFT having a back channel etched (BCE) structure, the channel comprises a front conductive channel in close proximity to the gate electrode and a back channel that is exposed outside. For an N-type doped semiconductor layer, when a positive bias is applied to the gate electrode, the front conductive channel that is in close proximity to the gate electrode (the front conductive channel and the gate electrode being separated by an insulation layer) accumulates electrons therein so that the TFT is in an ON state, so that when a bias between the source and drain electrodes is increased, an electric current flows through the TFT.

Although in view of the spatial relationship, the back channel of the TFT is spaced from the front conductive channel by a distance that is relatively far the property of the back channel interface of the TFT has a vital influence on an output electrical curve of the TFT. For the TFT having the BCE structure, the process for forming the channel may easily damage the back channel. Further, the damaged back channel, once exposed to the atmosphere, may readily cause defects in the back channel due to attachment of moisture/oxygen thereto, thereby leading to deterioration of the TFT characteristic curve identified in a stability test and an increase of leakage current so as to result reduction of device stability. A solution is to use a TFT that adopts an etch stop layer (ESL) involved structure in which SiOx is provided for protecting the back channel. However, materials of the type of SiOx provide only a limited capability of blocking water. Further, in such a structure, the connection between a metal electrode and a semiconductor layer is achieved with a via. Thus, an additional masking process would be needed in an actual manufacturing process for forming the via. This extends the manufacturing time and increases the manufacturing cost.

Graphene is a nanometer material that is currently known to be the thinnest and hardest. Since it shows excellent electric adjustability, mechanical property, and thermal conductivity, it is one of the current hot spots of researches. It is proposed a graphene film manufactured with a roll-to-roll manner shows extremely low sheet resistance (<$100\Omega/\square-1$) and allows for formation of a two-dimensional insulation material with a wide band gap after being doped. Further, a single layer of graphene shows excellent property of blocking moisture/oxygen and may effectively prevent oxidization of metal. Finally, there are a lot of successful examples showing that the property of a graphene film of a single layer or multiple layers will not be significantly damaged when transferred from a substrate to another substrate.

SUMMARY OF THE INVENTION

An object of the present invention is to provide a thin-film transistor (TFT) substrate structure, which comprises a modified graphene layer that shows an insulation property arranged on a channel zone of a semiconductor layer so that the property of graphene for blocking moisture/oxygen is used to protect the channel zone, making the TFT device show excellent I-V (current-voltage) output characteristics and stability.

Another object of the present invention is to provide a manufacturing method of a TFT substrate structure, in which a graphene layer is formed on a semiconductor layer and after the formation of a second metal layer, the second metal layer is used as a shielding mask to inject fluoride ions into the graphene layer in order to form a modified area in a portion of the graphene layer that is located above and corresponds to the channel zone of the semiconductor layer, whereby the modified area of the graphene layer shows excellent property of insulation and blocking of moisture/oxygen and provides a protection to the channel zone, making the TFT device show excellent I-V (current-voltage) output characteristics and stability.

To achieve the above objects, the present invention provides a TFT substrate structure, which comprises: a base plate, a gate electrode formed on the base plate, a gate insulation layer formed on the base plate and covering the gate electrode, a semiconductor layer formed on the gate insulation layer, a graphene layer formed on the semiconductor layer, and source and drain electrodes formed on the graphene layer;

wherein the semiconductor layer comprises a channel zone and a source contact zone and a drain contact zone respectively formed on two sides of the channel zone;

the graphene layer comprises a first modified area located on and corresponding to the channel zone, second modified areas respectively located outside and corresponding to the source and drain electrodes, and first and second non-modified areas respectively located under and corresponding to the source and drain electrodes, the first and second modified areas of the graphene layer being graphene that is doped with fluoride ions and shows a property of insulation, the non-modified areas of the graphene layer being not subjected to doping and show a property of electrical conduction; and the source and drain electrodes are respectively and electrically connected via the first and second non-modified areas of the graphene layer to the source contact zone and the drain contact zone of the semiconductor layer, the first modified area of the graphene layer covering the channel zone of the semiconductor layer to provide protection.

The base plate comprises a glass plate or a plastic plate; the gate electrode is formed of a material comprising one of molybdenum, titanium, aluminum, and copper, or a combination of multiple ones thereof; and the gate insulation layer is formed of a material comprising silicon oxide, silicon nitride, or a combination thereof.

The semiconductor layer comprises one of the following three structures:

(I) the semiconductor layer comprises a metal oxide semiconductor layer;

(II) the semiconductor layer comprises an amorphous silicon layer; and (III) the semiconductor layer comprises an amorphous silicon layer and first and second N-type heavily-doped amorphous silicon layers formed in the amorphous silicon layer and respectively located at two side portions thereof.

The graphene protection layer comprises a single-layer graphene film or a multiple-layer graphene film.

The present invention also provides a manufacturing method of a TFT substrate structure, which comprises the following steps:

(1) providing a base plate, depositing a first metal layer on the base plate, and patterning the first metal layer to form a gate electrode;

(2) depositing a gate insulation layer on the gate electrode and the base plate;

(3) depositing and patterning a semiconductor layer on the gate insulation layer;

(4) forming a graphene layer on the semiconductor layer;

(5) depositing a second metal layer on the graphene layer and patterning the second metal layer to form source and drain electrodes; and (6) defining a portion of the semiconductor layer that corresponds to an area between the source and drain electrodes as a channel zone and areas that are respectively located on two sides of the channel zone and under the source and drain electrodes being a source contact zone and a drain contact zone;

using the second metal layer as a shielding mask, applying $SF_6$ plasma to conduct an ion injection operation for injecting fluoride ions into an area of the graphene layer that is not shielded by the second metal layer in order to perform property modification thereby forming a first modified area in the graphene layer to be located on and corresponding to the channel zone, second modified areas respectively located outside and corresponding to the source and drain electrodes, and first and second non-modified areas respectively located under and corresponding to the source and drain electrodes, the first and second modified areas of the graphene layer being graphene that is doped with fluoride ions and showing a property of insulation, and the first and second non-modified areas of the graphene layer being not subjected to doping and showing a property of electrical conduction;

the source and drain electrodes being respectively and electrically connected via the first and second non-modified areas of the graphene layer to the source contact zone and the drain contact zone of the semiconductor layer; the first modified area of the graphene layer covering the channel zone of the semiconductor layer to provide protection.

An operation process of step (3) comprises: adopting physical vapor deposition to deposit, on the gate insulation layer, a metal oxide semiconductor layer, which is patterned by applying a photolithographic process so as to obtain the semiconductor layer, wherein the semiconductor layer so formed is a metal oxide semiconductor layer.

An operation process of step (3) comprises: adopting chemical vapor deposition to deposit, on the gate insulation layer, an amorphous silicon layer, which is patterned by applying a photolithographic process so as to obtain the semiconductor layer, wherein the semiconductor layer so formed is an amorphous silicon layer.

An operation process of step (3) comprises:

(31) adopting chemical vapor deposition to sequentially deposit an amorphous silicon layer and an N-type heavily-doped amorphous silicon layer on the gate insulation layer; and (32) applying a photolithographic process to pattern the amorphous silicon layer and the N-type heavily-doped amorphous silicon layer in order to remove portions of the amorphous silicon layer and the N-type heavily-doped amorphous silicon layer that are located outside a TFT area and forming a strip-like channel in a middle portion of the N-type heavily-doped amorphous silicon layer that corresponds to the gate electrode so as to divide the N-type heavily-doped amorphous silicon layer into first and second N-type heavily-doped amorphous silicon segments respectively located at two sides of the strip-like channel to thereby obtain the semiconductor layer, wherein the semiconductor layer so formed comprises an amorphous silicon layer and first and second N-type heavily-doped amorphous silicon layers formed on the amorphous silicon layer and respectively located on two sides thereof.

Step (4) is performed by using a transfer method to make the graphene layer, which comprises the following steps:

(41) providing a $SiO_2$ base and depositing, through chemical vapor deposition, a single-layer graphene film on $SiO_2$ base;

(42) spin-coating a poly(methyl methacrylate) (PMMA) film on the $SiO_2$ base and the single-layer graphene film;

(43) using a 1M NaOH alkaline solution to conduct wet etching on the $SiO_2$ base that has completed step (42) to have the PMMA/the single-layer graphene film separate from a surface of the $SiO_2$ base and float up to water surface; and (44) transferring the PMMA/the single-layer graphene film to the semiconductor layer and using acetone to slow dissolve and remove PMMA, so that the single-layer graphene film is completely transferred to and set on the semiconductor layer, wherein the graphene layer so formed is a single-layer graphene film.

Step (4) is performed by applying spin-coating, spray-coating, roll-coating, or slot-coating to form a multiple-layer graphene film on the semiconductor layer, wherein the graphene layer so formed is a multiple-layer graphene film.

The present invention further provides a TFT substrate structure, which comprises: a base plate, a gate electrode formed on the base plate, a gate insulation layer formed on the base plate and covering the gate electrode, a semiconductor layer formed on the gate insulation layer, a graphene layer formed on the semiconductor layer, and source and drain electrodes formed on the graphene layer;

wherein the semiconductor layer comprises a channel zone and a source contact zone and a drain contact zone respectively formed on two sides of the channel zone;

the graphene layer comprises a first modified area located on and corresponding to the channel zone, second modified areas respectively located outside and corresponding to the source and drain electrodes, and first and second non-modified areas respectively located under and corresponding to the source and drain electrodes, the first and second modified areas of the graphene layer being graphene that is doped with fluoride ions and shows a property of insulation, the non-modified areas of the graphene layer being not subjected to doping and show a property of electrical conduction; and the source and drain electrodes are respectively and electrically connected via the first and second non-modified areas of the graphene layer to the source contact zone and the drain contact zone of the semiconductor layer, the first modified area of the graphene layer covering the channel zone of the semiconductor layer to provide protection;

wherein the base plate comprises a glass plate or a plastic plate; the gate electrode is formed of a material comprising one of molybdenum, titanium, aluminum, and copper, or a combination of multiple ones thereof; and the gate insulation layer is formed of a material comprising silicon oxide, silicon nitride, or a combination thereof;

wherein the semiconductor layer comprises one of the following three structures:

(I) the semiconductor layer comprises a metal oxide semiconductor layer;

(II) the semiconductor layer comprises an amorphous silicon layer; and (III) the semiconductor layer comprises an amorphous silicon layer and first and second N-type heavily-doped amorphous silicon layers formed in the amorphous silicon layer and respectively located at two side portions thereof;

wherein the graphene protection layer comprises a single-layer graphene film or a multiple-layer graphene film.

The efficacy of the present invention is that the present invention provides a TFT substrate structure, in which a modified graphene layer having the property of electrical insulation is arranged on the channel zone of the semiconductor layer so that through the property of graphene for blocking moisture/oxygen, the channel zone is protected and through the properties of graphene for excellent electrical conduction and for being convertible into an insulator after being doped with ions, the conventional structure that comprises a via formed in a TFT protection layer for electrical connection between the source and drain electrodes and the semiconductor layer can be changed so as to provides the TFT device with desired I-V (current-voltage) output characteristics and stability. The present invention provides a manufacturing method of a TFT substrate structure, in which a graphene layer is formed on a semiconductor layer and after the formation of a second metal layer, the second metal layer is used as a shielding mask to conduct injection of fluoride ions into the graphene layer to form a modified area in a portion of the graphene layer that is located on and corresponds to a channel zone of the semiconductor layer, wherein the modified area of the graphene layer shows a property of electrical insulation and a property of blocking moisture/oxygen so as to provide protection to the channel zone; portions of the graphene layer that are located under source and drain electrodes are not doped with ions and preserves the excellent electrical conduction property of graphene and thus electrical connection between the source and drain electrodes and the semiconductor layer can be achieved without formation of a via in the graphene layer, making a TFT device so manufactured showing excellent I-V (current-voltage) output characteristics and stability, saving one mask operation process, shortening the manufacturing time, and lowering down the manufacturing cost. In the present invention, film formation of the graphene layer can be achieved with various processes and solution-cast film forming may be used, or alternatively, large area single-layer film transferring may be used, thereby providing improved flexibility for manufacturing.

For better understanding of the features and technical contents of the present invention, reference will be made to the following detailed description of the present invention and the attached drawings. However, the drawings are provided for the purposes of reference and illustration and are not intended to impose limitations to the present invention.

BRIEF DESCRIPTION OF THE DRAWINGS

The features and technical contents of the present invention will be apparent from the following detailed description of the present invention and the attached drawing; however, these drawings are provided for reference and illustration and are not intended to limit the scope of the present invention. In the drawing.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
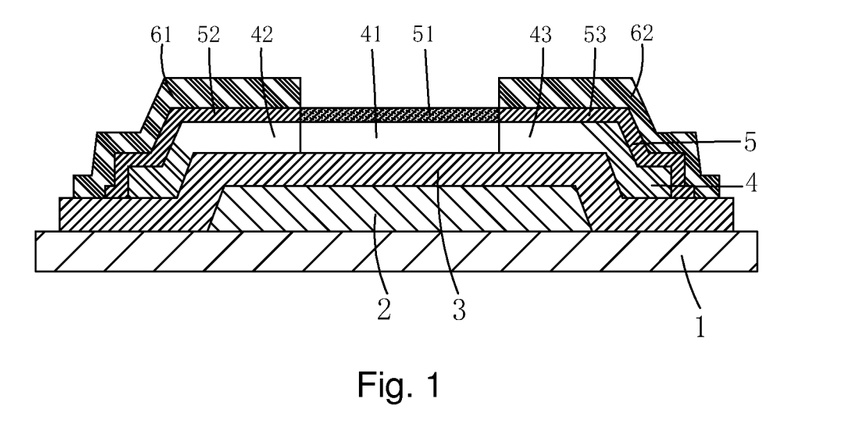
FIG. 1 is a schematic view showing a cross-section of a thin-film transistor (TFT) substrate structure according to the present invention.
Figure 2:
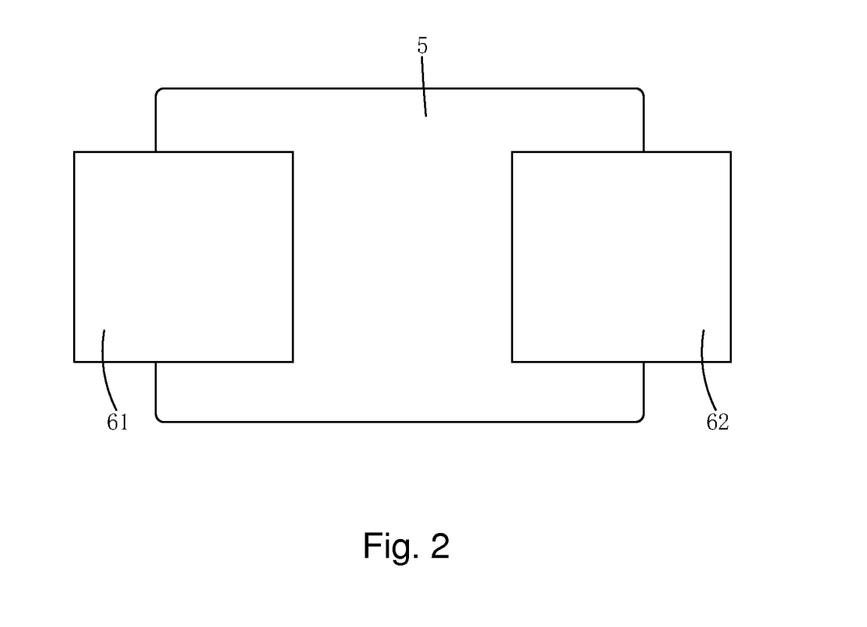
FIG. 2 is a top plan view of the TFT substrate structure according to the present invention.

Referring to FIGS. 1-2, firstly, the present invention provides a thin-film transistor (TFT) substrate structure. The TFT substrate structure comprises: a base plate 1, a gate electrode 2 formed on the base plate 1, a gate insulation layer 3 formed on the base plate 1 and covering the gate electrode 2, a semiconductor layer 4 formed on the gate insulation layer 3, a graphene layer 5 formed on the semiconductor layer 4, and source and drain electrodes 61, 62 formed on the graphene layer 5.

The semiconductor layer 4 comprises a channel zone 41 and a source contact zone 42 and a drain contact zone 43 respectively formed on two sides of the channel zone 41.

The graphene layer 5 comprises a first modified area 51 located on and corresponding to the channel zone 41, second modified areas 52 respectively located outside and corresponding to the source and drain electrodes 61, 62, and first and second non-modified areas 53, 54 respectively located under and corresponding to the source and drain electrodes 61, 62. The first and second modified areas 51, 52 of the graphene layer 5 are graphene that is doped with fluoride ions and shows a property of insulation. The non-modified areas 53 of the graphene layer 5 are not subjected to doping and show a property of electrical conduction.

The source and drain electrodes 61, 62 are respectively and electrically connected via the first and second non-modified areas 53, 54 of the graphene layer 5 to the source contact zone 42 and the drain contact zone 43 of the semiconductor layer 4. The first modified area 51 of the graphene layer 5 covers the channel zone 41 of the semiconductor layer 4 to provide protection. Thus, electrical connection can be achieved between the source and drain electrodes and the semiconductor layer without formation of a via in the graphene layer 5 so as to make a TFT device showing excellent I-V output characteristics and stability.

Specifically, the base plate 1 can be a glass plate or a plastic plate.

The gate electrode 2 is formed of a material comprising one of molybdenum (Mo), titanium (Ti), aluminum (Al), and copper (Cu), or a combination of multiple ones thereof.

The gate insulation layer 3 is formed of a material comprising silicon oxide, silicon nitride, or a combination thereof.

Specifically, the semiconductor layer 4 may comprise one of the following three structures:

(I) The semiconductor layer 4 comprises a metal oxide semiconductor layer and the metal oxide semiconductor layer is formed of a material of indium gallium zinc oxide (IGZO);

(II) the semiconductor layer 4 comprises an amorphous silicon (a-Si) layer; and (III) the semiconductor layer 4 comprises an amorphous silicon layer and first and second N-type heavily-doped amorphous silicon layers formed in the amorphous silicon layer and respectively located at two side portions thereof. The inclusion of the first and second N-type heavily-doped amorphous silicon layers help further reduce contact resistance between semiconductor 4 and the source and drain electrodes 61, 62 and thus improve current efficiency.

Specifically, the graphene layer 5 can be a single-layer graphene film or a multiple-layer graphene film.

The source and drain electrodes 61, 62 are formed of a material comprising one of molybdenum (Mo), titanium (Ti), aluminum (Al), and copper (Cu), or a combination of multiple ones thereof.

In the above-described TFT substrate structure, a modified graphene layer having the property of electrical insulation is arranged on the channel zone of the semiconductor layer so that through the property of graphene for blocking moisture/oxygen, the channel zone is protected and through the properties of graphene for excellent electrical conduction and for being convertible into an insulator after being doped with ions, the conventional structure that comprises a via formed in a TFT protection layer for electrical connection between the source and drain electrodes and the semiconductor layer can be changed so as to provides the TFT device with desired I-V (current-voltage) output characteristics and stability.

Figure 3:
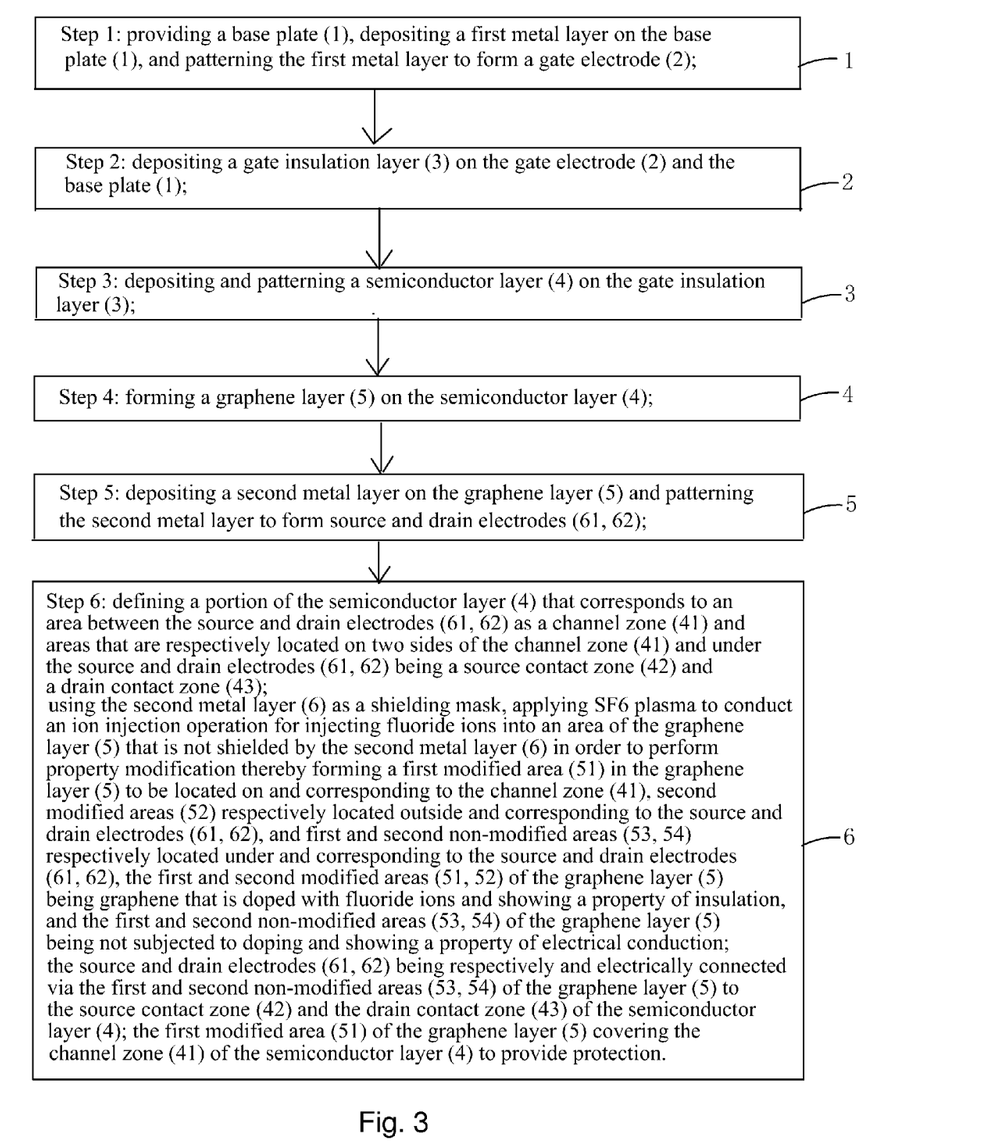
FIG. 3 is a flow chart illustrating a manufacturing method of a TFT substrate structure according to the present invention.
Figure 4:
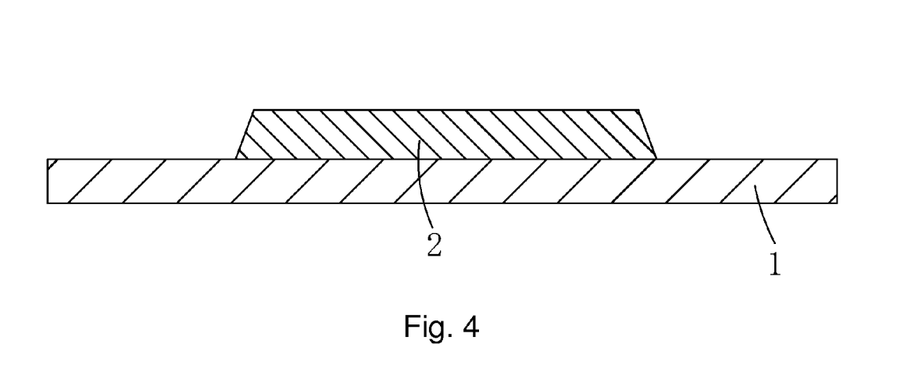
FIG. 4 is a schematic view illustrating a first step of the manufacturing method of the TFT substrate structure according to the present invention.

Referring to FIG. 3, the present invention also provides a manufacturing method of a TFT substrate structure, which is characterized by comprising the following steps:

Step 1: as shown in FIG. 4, providing a base plate 1, depositing a first metal layer on the base plate 1, and patterning the first metal layer to form a gate electrode 2.

Specifically, the base plate 1 can be a glass plate or a plastic plate.

Specifically, physical vapor deposition (PVD) is adopted for depositing the first metal layer and a photolithographic process is applied to pattern the first metal layer. The first metal layer is formed of a material comprising one of molybdenum (Mo), titanium (Ti), aluminum (Al), and copper (Cu), or a combination of multiple ones thereof.

Figure 5:
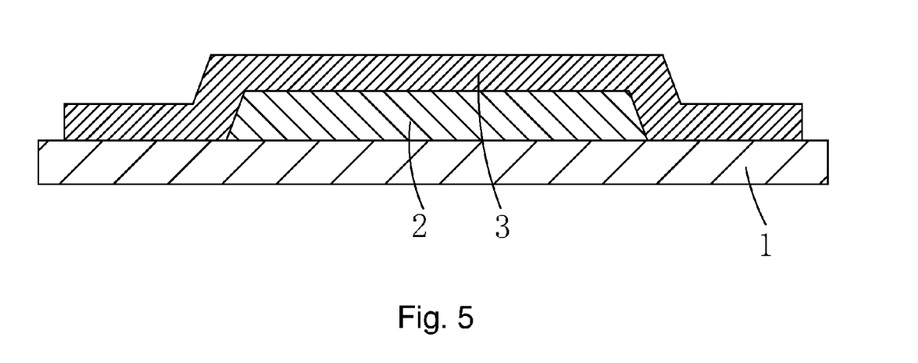
FIG. 5 is a schematic view illustrating a second step of the manufacturing method of the TFT substrate structure according to the present invention.

Step 2: as shown in FIG. 5, depositing a gate insulation layer 3 on the gate electrode 2 and the base plate 1.

Specifically, chemical vapor deposition (CVD) is adopted for depositing the gate insulation layer 3 and the gate insulation layer 3 is formed of a material comprising silicon oxide, silicon nitride, or a combination thereof.

Figure 6:
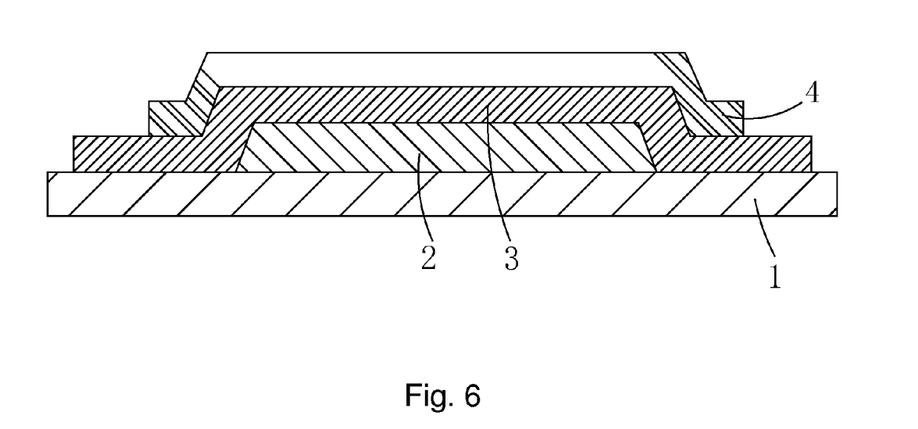
FIG. 6 is a schematic view illustrating a third step of the manufacturing method of the TFT substrate structure according to the present invention.

Step 3: as shown in FIG. 6, depositing and patterning a semiconductor layer 4 on the gate insulation layer 3.

Specifically, Step 3 is performed with one of the following three processes:

(I) A specific operation process of Step 3 is: adopting physical vapor deposition to deposit, on the gate insulation layer 3, a metal oxide semiconductor layer, which is patterned by applying a photolithographic process so as to obtain the semiconductor layer 4, wherein the semiconductor layer 4 so formed is a metal oxide semiconductor layer.

Specifically, the metal oxide semiconductor layer is formed of a material of indium gallium zinc oxide (IGZO).

(II) A specific operation process of Step 3 is: adopting chemical vapor deposition to deposit, on the gate insulation layer 3, an amorphous silicon layer, which is patterned by applying a photolithographic process so as to obtain the semiconductor layer 4, wherein the semiconductor layer 4 so formed is an amorphous silicon layer.

(III) A specific operation process of Step 3 is:

Step 31: adopting chemical vapor deposition to sequentially deposit an amorphous silicon layer and an N-type heavily-doped amorphous silicon layer on the gate insulation layer 3; and Step 32: applying a photolithographic process to pattern the amorphous silicon layer and the N-type heavily-doped amorphous silicon layer in order to remove portions of the amorphous silicon layer and the N-type heavily-doped amorphous silicon layer that are located outside a TFT area and forming a strip-like channel in a middle portion of the N-type heavily-doped amorphous silicon layer that corresponds to the gate electrode 2 so as to divide the N-type heavily-doped amorphous silicon layer into first and second N-type heavily-doped amorphous silicon segments respectively located at two sides of the strip-like channel to thereby obtain the semiconductor layer 4, wherein the semiconductor layer 4 so formed comprises an amorphous silicon layer and first and second N-type heavily-doped amorphous silicon layers formed on the amorphous silicon layer and respectively located on two sides thereof.

Figure 7:
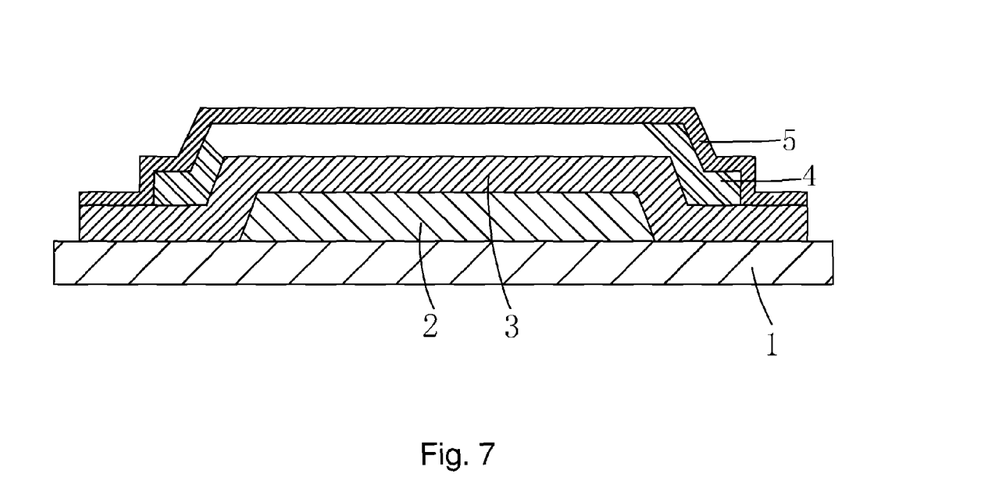
FIG. 7 is a schematic view illustrating a fourth step of the manufacturing method of the TFT substrate structure according to the present invention.

Step 4: as shown in FIG. 7, forming a graphene layer 5 on the semiconductor layer 4.

Specifically, Step 4 is performed by using a transfer method to make the graphene layer 5, which specifically comprises the following steps:

Step 41: providing a $SiO_2$ base and depositing, through chemical vapor deposition, a single-layer graphene film on $SiO_2$ base;

Step 42: spin-coating a poly(methyl methacrylate) (PMMA) film on the $SiO_2$ base and the single-layer graphene film;

Step 43: using a 1M NaOH alkaline solution to conduct wet etching on the $SiO_2$ base that has completed Step 42 to such an extent that a surface of the $SiO_2$ base is softened, whereby the PMMA/the single-layer graphene film separates from the surface of $SiO_2$ base and floats up to water surface; and Step 44: transferring the PMMA/the single-layer graphene film to the semiconductor layer 4 and using acetone to slow dissolve and remove PMMA, so that the single-layer graphene film is completely transferred to and set on the semiconductor layer 4, wherein the graphene layer 5 so formed is a single-layer graphene film.

Specifically, Step 4 can be alternatively performed: applying spin-coating, spray-coating, roll-coating, or slot-coating to form a multiple-layer graphene film on the semiconductor layer 4, wherein the graphene layer 5 so formed is a multiple-layer graphene film.

Figure 8:
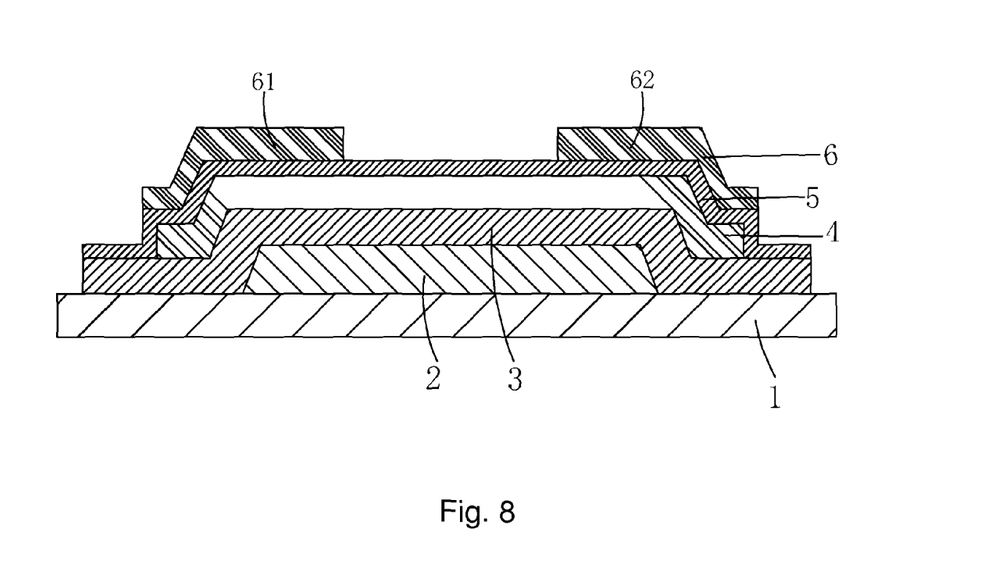
FIG. 8 is a schematic view illustrating a fifth step of the manufacturing method of the TFT substrate structure according to the present invention.

Step 5: as shown in FIG. 8, depositing a second metal layer 6 on the graphene layer 5 and patterning the second metal layer 6 to form source and drain electrodes 61, 62.

Specifically, physical vapor deposition (PVD) is adopted to deposit the second metal layer and a photolithographic process is applied to pattern the second metal layer. The second metal layer is formed of a material comprising one of molybdenum (Mo), titanium (Ti), aluminum (Al), and copper (Cu), or a combination of multiple ones thereof.

Step 6: referring to FIG. 1, defining a portion of the semiconductor layer 4 that corresponds to an area between the source and drain electrodes 61, 62 as a channel zone 41 and areas that are respectively located on two sides of the channel zone 41 and under the source and drain electrodes 61, 62 being a source contact zone 42 and a drain contact zone 43;

using the second metal layer 6 as a shielding mask, applying $SF_6$ plasma to conduct an ion injection operation for injecting fluoride ions into an area of the graphene layer 5 that is not shielded by the second metal layer 6 in order to perform property modification thereby forming a first modified area 51 in the graphene layer 5 to be located on and corresponding to the channel zone 41, second modified areas 52 respectively located outside and corresponding to the source and drain electrodes 61, 62, and first and second non-modified areas 53, 54 respectively located under and corresponding to the source and drain electrodes 61, 62. The first and second modified areas 51, 52 of the graphene layer 5 are graphene that is doped with fluoride ions and shows a property of insulation; and the first and second non-modified areas 53, 54 of the graphene layer 5 are not subjected to doping and show a property of electrical conduction;

the source and drain electrodes 61, 62 are respectively and electrically connected via the first and second non-modified areas 53, 54 of the graphene layer 5 to the source contact zone 42 and the drain contact zone 43 of the semiconductor layer 4; the first modified area 51 of the graphene layer 5 covers the channel zone 41 of the semiconductor layer 4 to provide protection, thereby forming a TFT substrate structure as shown in FIGS. 1 and 2.

In the above-described manufacturing method of a TFT substrate structure, a graphene layer is formed on a semiconductor layer and after the formation of a second metal layer, the second metal layer is used as a shielding mask to conduct injection of fluoride ions into the graphene layer to form a modified area in a portion of the graphene layer that is located on and corresponds to a channel zone of the semiconductor layer, wherein the modified area of the graphene layer shows a property of electrical insulation and a property of blocking moisture/oxygen so as to provide protection to the channel zone; portions of the graphene layer that are located under source and drain electrodes are not doped with ions and preserves the excellent electrical conduction property of graphene and thus electrical connection between the source and drain electrodes and the semiconductor layer can be achieved without formation of a via in the graphene layer, making a TFT device so manufactured showing excellent I-V (current-voltage) output characteristics and stability, wherein film formation of the graphene layer can be achieved with various processes and solution-cast film forming may be used, or alternatively, large area single-layer film transferring may be used, thereby providing improved flexibility for manufacturing; further, the process uses the source and drain electrodes as a shielding mask to make the portion of the graphene layer located on the channel zone an excellent insulator thereby saving one mask operation process and thus lowering down the manufacturing cost.

In summary, the present invention provides a TFT substrate structure, in which a modified graphene layer having the property of electrical insulation is arranged on the channel zone of the semiconductor layer so that through the property of graphene for blocking moisture/oxygen, the channel zone is protected and through the properties of graphene for excellent electrical conduction and for being convertible into an insulator after being doped with ions, the conventional structure that comprises a via formed in a TFT protection layer for electrical connection between the source and drain electrodes and the semiconductor layer can be changed so as to provides the TFT device with desired I-V (current-voltage) output characteristics and stability. The present invention provides a manufacturing method of a TFT substrate structure, in which a graphene layer is formed on a semiconductor layer and after the formation of a second metal layer, the second metal layer is used as a shielding mask to conduct injection of fluoride ions into the graphene layer to form a modified area in a portion of the graphene layer that is located on and corresponds to a channel zone of the semiconductor layer, wherein the modified area of the graphene layer shows a property of electrical insulation and a property of blocking moisture/oxygen so as to provide protection to the channel zone; portions of the graphene layer that are located under source and drain electrodes are not doped with ions and preserves the excellent electrical conduction property of graphene and thus electrical connection between the source and drain electrodes and the semiconductor layer can be achieved without formation of a via in the graphene layer, making a TFT device so manufactured showing excellent I-V (current-voltage) output characteristics and stability, saving one mask operation process, shortening the manufacturing time, and lowering down the manufacturing cost. In the present invention, film formation of the graphene layer can be achieved with various processes and solution-cast film forming may be used, or alternatively, large area single-layer film transferring may be used, thereby providing improved flexibility for manufacturing.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A thin-film transistor (TFT) substrate structure, comprising:
    a base plate, a gate electrode formed on the base plate, a gate insulation layer formed on the base plate and covering the gate electrode, a semiconductor layer formed on the gate insulation layer, a graphene layer formed on the semiconductor layer, and source and drain electrodes formed on the graphene layer;
    wherein the semiconductor layer comprises a channel zone and a source contact zone and a drain contact zone respectively formed on two sides of the channel zone; the graphene layer comprises a first modified area located on and corresponding to the channel zone, second modified areas respectively located outside and corresponding to the source and drain electrodes, and first and second non-modified areas respectively located under and corresponding to the source and drain electrodes, the first and second modified areas of the graphene layer being graphene that is doped with fluoride ions and shows a property of insulation, the non-modified areas of the graphene layer being not subjected to doping and show a property of electrical conduction; and
    the source and drain electrodes are respectively and electrically connected via the first and second non-modified areas of the graphene layer to the source contact zone and the drain contact zone of the semiconductor layer, the first modified area of the graphene layer covering the channel zone of the semiconductor layer to provide protection.

2. The TFT substrate structure as claimed in claim 1, wherein the base plate comprises a glass plate or a plastic plate; the gate electrode is formed of a material comprising one of molybdenum, titanium, aluminum, and copper, or a combination of multiple ones thereof; and the gate insulation layer is formed of a material comprising silicon oxide, silicon nitride, or a combination thereof.

3. The TFT substrate structure as claimed in claim 1, wherein the semiconductor layer comprises one of the following three structures:
   (I) the semiconductor layer comprises a metal oxide semiconductor layer;
   (II) the semiconductor layer comprises an amorphous silicon layer; and
   (III) the semiconductor layer comprises an amorphous silicon layer and first and second N-type heavily-doped amorphous silicon layers formed in the amorphous silicon layer and respectively located at two side portions thereof.

4. The TFT substrate structure as claimed in claim 1, wherein the graphene protection layer comprises a single-layer graphene film or a multiple-layer graphene film.

5. A manufacturing method of a thin-film transistor (TFT) substrate structure, comprising the following steps:
   (1) providing a base plate, depositing a first metal layer on the base plate, and patterning the first metal layer to form a gate electrode;
   (2) depositing a gate insulation layer on the gate electrode and the base plate;
   (3) depositing and patterning a semiconductor layer on the gate insulation layer;
   (4) forming a graphene layer on the semiconductor layer;
   (5) depositing a second metal layer on the graphene layer and patterning the second metal layer to form source and drain electrodes; and
   (6) defining a portion of the semiconductor layer that corresponds to an area between the source and drain electrodes as a channel zone and areas that are respectively located on two sides of the channel zone and under the source and drain electrodes being a source contact zone and a drain contact zone;
   using the second metal layer as a shielding mask, applying $SF_6$ plasma to conduct an ion injection operation for injecting fluoride ions into an area of the graphene layer that is not shielded by the second metal layer in order to perform property modification thereby forming a first modified area in the graphene layer to be located on and corresponding to the channel zone, second modified areas respectively located outside and corresponding to the source and drain electrodes, and first and second non-modified areas respectively located under and corresponding to the source and drain electrodes, the first and second modified areas of the graphene layer being graphene that is doped with fluoride ions and showing a property of insulation, and the first and second non-modified areas of the graphene layer being not subjected to doping and showing a property of electrical conduction;
   the source and drain electrodes being respectively and electrically connected via the first and second non-modified areas of the graphene layer to the source contact zone and the drain contact zone of the semiconductor layer; the first modified area of the graphene layer covering the channel zone of the semiconductor layer to provide protection.

6. The manufacturing method of the TFT substrate structure as claimed in claim 5, wherein an operation process of step (3) comprises: adopting physical vapor deposition to deposit, on the gate insulation layer, a metal oxide semiconductor layer, which is patterned by applying a photolithographic process so as to obtain the semiconductor layer, wherein the semiconductor layer so formed is a metal oxide semiconductor layer.

7. The manufacturing method of the TFT substrate structure as claimed in claim 5, wherein an operation process of step (3) comprises: adopting chemical vapor deposition to deposit, on the gate insulation layer, an amorphous silicon layer, which is patterned by applying a photolithographic process so as to obtain the semiconductor layer, wherein the semiconductor layer so formed is an amorphous silicon layer.

8. The manufacturing method of the TFT substrate structure as claimed in claim 5, wherein an operation process of step (3) comprises:
   (31) adopting chemical vapor deposition to sequentially deposit an amorphous silicon layer and an N-type heavily-doped amorphous silicon layer on the gate insulation layer; and
   (32) applying a photolithographic process to pattern the amorphous silicon layer and the N-type heavily-doped amorphous silicon layer in order to remove portions of the amorphous silicon layer and the N-type heavily-doped amorphous silicon layer that are located outside a TFT area and forming a strip-like channel in a middle portion of the N-type heavily-doped amorphous silicon layer that corresponds to the gate electrode so as to divide the N-type heavily-doped amorphous silicon layer into first and second N-type heavily-doped amorphous silicon segments respectively located at two sides of the strip-like channel to thereby obtain the semiconductor layer, wherein the semiconductor layer so formed comprises an amorphous silicon layer and first and second N-type heavily-doped amorphous silicon layers formed on the amorphous silicon layer and respectively located on two sides thereof.

9. The manufacturing method of the TFT substrate structure as claimed in claim 5, wherein step (4) is performed by using a transfer method to make the graphene layer, which comprises the following steps:
   (41) providing a $SiO_2$ base and depositing, through chemical vapor deposition, a single-layer graphene film on $SiO_2$ base;
   (42) spin-coating a poly(methyl methacrylate) (PMMA) film on the $SiO_2$ base and the single-layer graphene film;
   (43) using a 1M NaOH alkaline solution to conduct wet etching on the $SiO_2$ base that has completed step (42) to have the PMMA/the single-layer graphene film separate from a surface of the $SiO_2$ base and float up to water surface; and
   (44) transferring the PMMA/the single-layer graphene film to the semiconductor layer and using acetone to slow dissolve and remove PMMA, so that the single-layer graphene film is completely transferred to and set on the semiconductor layer, wherein the graphene layer so formed is a single-layer graphene film.

10. The manufacturing method of the TFT substrate structure as claimed in claim 5, wherein step (4) is performed by applying spin-coating, spray-coating, roll-coating, or slot-coating to form a multiple-layer graphene film on the semiconductor layer, wherein the graphene layer so formed is a multiple-layer graphene film.

11. A thin-film transistor (TFT) substrate structure, comprising: a base plate, a gate electrode formed on the base plate, a gate insulation layer formed on the base plate and covering the gate electrode, a semiconductor layer formed on the gate insulation layer, a graphene layer formed on the semiconductor layer, and source and drain electrodes formed on the graphene layer;
- wherein the semiconductor layer comprises a channel zone and a source contact zone and a drain contact zone respectively formed on two sides of the channel zone;
- the graphene layer comprises a first modified area located on and corresponding to the channel zone, second modified areas respectively located outside and corresponding to the source and drain electrodes, and first and second non-modified areas respectively located under and corresponding to the source and drain electrodes, the first and second modified areas of the graphene layer being graphene that is doped with fluoride ions and shows a property of insulation, the non-modified areas of the graphene layer being not subjected to doping and show a property of electrical conduction; and
- the source and drain electrodes are respectively and electrically connected via the first and second non-modified areas of the graphene layer to the source contact zone and the drain contact zone of the semiconductor layer, the first modified area of the graphene layer covering the channel zone of the semiconductor layer to provide protection;

wherein the base plate comprises a glass plate or a plastic plate; the gate electrode is formed of a material comprising one of molybdenum, titanium, aluminum, and copper, or a combination of multiple ones thereof; and the gate insulation layer is formed of a material comprising silicon oxide, silicon nitride, or a combination thereof;

wherein the semiconductor layer comprises one of the following three structures:
(I) the semiconductor layer comprises a metal oxide semiconductor layer;
(II) the semiconductor layer comprises an amorphous silicon layer; and
(III) the semiconductor layer comprises an amorphous silicon layer and first and second N-type heavily-doped amorphous silicon layers formed in the amorphous silicon layer and respectively located at two side portions thereof;

wherein the graphene protection layer comprises a single-layer graphene film or a multiple-layer graphene film.

* * * * *